(12) United States Patent
Jacques

(10) Patent No.: US 7,116,695 B2
(45) Date of Patent: Oct. 3, 2006

(54) LASER OUTPUT LIGHT PULSE BEAM PARAMETER TRANSIENT CORRECTION SYSTEM

(75) Inventor: Robert N. Jacques, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 53 days.

(21) Appl. No.: 10/953,249

(22) Filed: Sep. 28, 2004

(65) Prior Publication Data

US 2006/0072636 A1    Apr. 6, 2006

(51) Int. Cl.
*H01S 3/223* (2006.01)
(52) U.S. Cl. .......................................... 372/58; 372/55
(58) Field of Classification Search ................. 372/58, 372/55
See application file for complete search history.

(56) References Cited

U.S. PATENT DOCUMENTS

| | | | |
|---|---|---|---|
| 6,005,879 A | 12/1999 | Sandstrom et al. | |
| 6,034,978 A | 3/2000 | Ujazdowski et al. | |
| 6,078,599 A | 6/2000 | Everage et al. | |
| 6,192,064 B1 | 2/2001 | Algots et al. | |
| 6,317,447 B1 | 11/2001 | Partlo et al. | |
| 6,529,531 B1* | 3/2003 | Everage et al. | 372/20 |
| 6,532,247 B1 | 3/2003 | Spangler et al. | |
| 6,567,450 B1 | 5/2003 | Myers et al. | |
| 6,621,846 B1 | 9/2003 | Sandstrom et al. | |
| 6,625,191 B1 | 9/2003 | Knowles et al. | |
| 6,650,666 B1 | 11/2003 | Spangler et al. | |
| 6,690,704 B1 | 2/2004 | Fallon et al. | |
| 6,721,340 B1 | 4/2004 | Fomenkov et al. | |
| 6,735,225 B1* | 5/2004 | Albrecht et al. | 372/25 |
| 2002/0141470 A1* | 10/2002 | Nakao et al. | 372/55 |

\* cited by examiner

Primary Examiner—Minsun Oh Harvey
Assistant Examiner—Tuan N. Nguyen
(74) Attorney, Agent, or Firm—William C. Cray

(57) ABSTRACT

An apparatus and method for producing laser output light pulses in bursts of pulses, at a selected pulse repetition rate, forming a laser output light beam, separated by an off time is disclosed, which may comprise a laser output light pulse beam parameter adjustment system, which may comprise a laser output light pulse beam parameter error detector providing a beam parameter error signal representative of the difference between the beam parameter and a selected target value for the beam parameter; a beam parameter adjustment mechanism; a beam parameter adjustment mechanism controller providing a beam parameter adjustment signal to the beam parameter adjustment mechanism based upon the value of the beam parameter error signal; a slow transient compensator providing a slow transient inversion signal modifying the beam parameter adjustment signal based upon the value of the beam parameter error signal. The apparatus and method may further comprise a beam parameter error scaling mechanism providing a normalized beam parameter error signal determined from the value of the beam parameter error signal; and the beam parameter adjustment mechanism controller and the slow transient controller providing, respectively, the beam parameter adjustment signal and the slow transient inversion signal based upon the normalized beam parameter error signal. The beam parameter adjustment mechanism controller may provide the beam parameter adjustment signal based upon a controller function that minimizes the average actual wavelength error or a windowed standard deviation of the actual wavelength error.

93 Claims, 4 Drawing Sheets

LASER OUTPUT LIGHT PULSE BEAM PARAMETER TRANSIENT CORRECTION SYSTEM

FIELD OF THE INVENTION

The present invention relates to the control of a parameter of a laser output light pulse beam that is produced in bursts of pulses and contains a parameter that is subject to a slow transient during the burst.

BACKGROUND OF THE INVENTION

U.S. Pat. No. 6,005,879, issued to Sandstrom et al. on Dec. 21, 1999, entitled PULSE ENERGY CONTROL FOR EXCIMER LASER, the disclosure of which is hereby incorporated by reference, relates to:
  A process for controlling pulse energy and integrated energy dose in bursts of pulses produced by an excimer laser. The energy of each pulse in each burst is measured. The rate of change of pulse energy with charging voltage is determined. A pulse energy error is determined for a previous pulse of the present burst. An integrated dose error is also determined for all previous pulses in the current burst. A charging voltage for the next pulse is determined using the pulse energy error, the integrated dose error, the rate of change of energy with charging voltage and a reference voltage. In a preferred embodiment, the rate of change of energy with voltage is determined by dithering the voltage during two pulses of each burst, once lower and once higher. The reference voltage is a voltage calculated using prior energy and voltage data. In this embodiment, the method of determining the reference voltage during a first portion of the pulse is different from the method used during a latter portion of the burst. During the first set of pulses (40 in this embodiment), for each pulse, a specified voltage calculated using voltage and energy data from a corresponding pulse in a previous burst is utilized as a prediction of the voltage needed to produce a pulse energy converging on a target pulse energy. For pulses 41 and thereafter the reference voltage for each pulse is the specified voltage for the previous pulse.

U.S. Pat. No. 6,034,978, issued to Ujazdowski et al. in Mar. 7, 2000, entitled GAS DISCHARGE LASER WITH GAS TEMPERATURE CONTROL, the disclosure of which is hereby incorporated by reference, relates to:
  A gas discharge laser with fast response gas temperature control to maintain laser gas temperature within desired limits during burst mode operation. Preferred embodiments include a passive temperature stabilizer . . . . Preferred embodiments utilize heating elements and coolant flow control to regulate laser gas temperatures using processors programmed to anticipate idle periods.

U.S. Pat. No. 6,317,447, issued to Partlo et al. on Nov. 13, 2001, entitled ELECTRIC DISCHARGE LASER WITH ACOUSTIC CHIRP CORRECTION, the disclosure of which is hereby incorporated by reference, relates to:
  Methods and structural changes in gas discharge lasers for minimizing wavelength chirp at high pulse rates. Applicants have identified the major cause of wavelength chirp in high pulse rate gas discharge lithography lasers as pressure waves from a discharge reflecting back to the discharge region coincident with a subsequent discharge . . . . During burst mode operation, the laser gas temperature . . . changes . . . over periods of a few milliseconds . . . changing . . . the location of the coincident pressure waves from pulse to pulse within the discharge region causing a variation in the pressure of the laser gas which in turn affects the index of refraction of the discharge region causing the laser beam exiting the rear of the laser to slightly change direction. This change in beam direction causes the grating in the LNP to reflect back . . . a slightly different wavelength causing the wavelength chirp. Solution to the problem is to include in the laser chamber structural elements to moderate or disperse the pressure waves and to maintain the laser gas temperature as close as feasible to constant values.

U.S. Pat. No. 6,529,531, issued to Everage et al. on Mar. 4, 2003, entitled, FAST WAVELENGTH CORRECTION TECHNIQUE FOR A LASER, the disclosure of which is hereby incorporated by reference, relates to:
  [An e]lectric discharge laser with fast chirp correction . . . includ[ing] at least one piezoelectric drive and a fast wavelength detection means and . . . a feedback response time of less than 1.0 millisecond. In a preferred embodiment a simple learning algorithm . . . allows advance tuning mirror adjustment in anticipation of the learned chirp pattern. Techniques include a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement.

U.S. Pat. No. 6,532,247, issued to Spangler et al. Mar. 11, 2003 LASER WAVELENGTH CONTROL UNIT WITH PIEZOELECTRIC DRIVER, the disclosure of which is hereby incorporated by reference, relates to:
  An electric discharge laser with fast wavelength correction. . . . Techniques include a combination of a relatively slow stepper motor and a very fast piezoelectric driver for tuning the laser wavelength using a tuning mirror. A preferred control technique is described (utilizing a very fast wavelength monitor) to provide the slow and intermediate wavelength control and a piezoelectric load cell in combination with the piezoelectric driver to provide the very fast (few microseconds) wavelength control.

U.S. Pat. No. 6,567,450, issued to Myers et al. on May 20, 2003, entitled VERY NARROW BAND, TWO CHAMBER, HIGH REP RATE GAS DISCHARGE LASER SYSTEM, relates to
  An injection seeded modular gas discharge laser system capable of producing high quality pulsed laser beams at pulse rates of about 4,000 Hz or greater and at pulse energies of about 5 ml or greater. Two separate discharge chambers are provided, one of which is a part of a master oscillator producing a very narrow band seed beam which is amplified in the second discharge chamber. The chambers can be controlled separately permitting separate optimization of wavelength parameters in the master oscillator and optimization of pulse energy parameters in the amplifying chamber. A preferred embodiment in an ArF excimer laser system configured as a MOPA and specifically designed for use as a light source for integrated circuit lithography. In the preferred MOPA embodiment, each chamber comprises a single tangential fan providing sufficient gas flow to permit operation at pulse rates of 4000 Hz or greater by clearing debris from the discharge region in less time than the approximately 0.25 milliseconds between pulses. The master oscillator is equipped with a line narrowing package having a very fast tuning mirror capable of controlling centerline wavelength on a pulse-to-pulse basis at repetition rates of 4000 Hz or greater to a precision of less than 0.2 pm.

U.S. Pat. No. 6,690,704, issued to Fallon et al. on Feb. 10, 2004, entitled CONTROL SYSTEM FOR A TWO CHAMBER GAS DISCHARGE LASER, the disclosure of which is hereby incorporated by reference, relates to:

[A] control system for a modular high repetition rate two discharge chamber ultraviolet gas discharge laser . . . with a master oscillator producing a very narrow band seed beam which is amplified in the second discharge chamber. Feedback timing control techniques are provided for controlling the relative timing of the discharges in the two chambers with an accuracy in the range of about 2 to 5 billionths of a second even in burst mode operation.

U.S. Pat. No. 6,625,191, issued to Knowles et al. on Sep. 23, 2003, entitled VERY NARROW BAND, TWO CHAMBER, HIGH REP RATE GAS DISCHARGE LASER SYSTEM, the disclosure of which is hereby incorporated by reference, relates to:

An injection seeded modular gas discharge laser system capable of producing high quality pulsed laser beams at pulse rates of about 4,000 Hz or greater and at pulse energies of about 5 mJ or greater. Two separate discharge chambers are provided, one of which is a part of a master oscillator producing a very narrow band seed beam which is amplified in the second discharge chamber. The chambers can be controlled separately permitting separate optimization of wavelength parameters in the master oscillator and optimization of pulse energy parameters in the amplifying chamber.

U.S. Pat. No. 6,650,666, issued to Spangler et al. on Nov. 18, 2003, entitled LASER WAVELENGTH CONTROL UNIT WITH PIEZOELECTRIC DRIVER, the disclosure of which is hereby incorprated by reference, relates to:

An electric discharge laser with fast wavelength correction. Fast wavelength correction equipment includes at least one piezoelectric drive and a fast wavelength measurement system and fast feedback response times. . . . Preferred embodiments provide (1) fast feedback control based on wavelength measurements, (2) fast vibration control, (3) active damping using the load cell and an active damping module, (4) transient inversion using feed forward algorithms based on historical burst data. A preferred embodiment adapts the feed forward algorithms to current conditions. Another preferred embodiment measures tuning mirror position to permit wavelength pretuning and active wavelength tuning.

U.S. Pat. No. 6,192,064, issued to Algots et al. on Feb. 20, 2001, entitled NARROW BAND LASER WITH FINE WAVELENGTH CONTROL, the disclosure of which is hereby incorporated by reference, relates to:

A smart laser having automatic computer control of pulse energy, wavelength and bandwidth using feedback signals from a wavemeter. Pulse energy is controlled by controlling discharge voltage. Wavelength is controlled by very fine and rapid positioning of an $R_{MAX}$ mirror in a line narrowing module. Bandwidth is controller by adjusting the curvature of a grating in the line narrowing module. Preferred embodiments include automatic feedback control of horizontal and vertical beam profile by automatic adjustment of a prism plate on which beam expander prisms are located and automatic adjustment of the $R_{MAX}$ tilt. Other preferred embodiments include automatic adjustment of the horizontal position of the laser chamber within the resonance cavity. In preferred embodiments, feedback signals from a wavelength monitor are used to position the $R_{MAX}$ mirror. In other preferred embodiments a separate laser beam reflected off the $R_{MAX}$ mirror on to a photodiode array is used to position the mirror.

U.S. Pat. No. 6,621,846, issued to Sandstrom et al. on Sep. 16, 2003, entitled ELECTRIC DISCHARGE LASER WITH ACTIVE WAVELENGTH CHIRP CORRECTION, the disclosure of which is hereby incorporated by reference, relates to:

[An e]lectric discharge laser with active chirp correction. This application discloses techniques for moderating and dispensing . . . pressure waves. In some lasers small predictable patterns remain which can be substantially corrected with active wavelength control using relatively slow wavelength control instruments of the prior art. In a preferred embodiment a simple learning algorithm is described to allow advance tuning mirror adjustment in anticipation of the learned chirp pattern. Embodiments include stepper motors having very fine adjustments so that size of tuning steps are substantially reduced for more precise tuning. However, complete elimination of wavelength chirp is normally not feasible with structural changes in the laser chamber and advance tuning; therefore, Applicants have developed equipment and techniques for very fast active chirp correction . . . includ[ing] a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement.

U.S. Pat. No. 6,721,340, issued to Fomenkov et al. on Apr. 13, 2004, entitled BANDWIDTH CONTROL TECHNIQUE FOR A LASER, the disclosure of which is hereby incorporated by reference, relates to:

A technique for bandwidth control of an electric discharge laser. Line narrowing equipment is provided having at least one piezoelectric drive and a fast bandwidth detection means and a bandwidth control having a time response of less than about 1.0 millisecond. In a preferred embodiment wavelength tuning mirror is dithered at dither rates of more than 500 dithers per second within a very narrow range of pivot angles to cause a dither in nominal wavelength values to produce a desired effective bandwidth of series of laser pulses.

U.S. Pat. No. 6,078,599, issued to Everage et al. on Jun. 20, 2000, entitled WAVELENGTH SHIFT CORRECTION TECHNIQUE FOR A LASER, the disclosure of which is hereby incorporated by reference, relates to:

A wavelength shift correction system for a laser system is provided for correcting wavelength chirps . . . includ[ing] a learning algorithm that learns characteristics of a wavelength chirp from a laser and a computer system that executes the learning algorithm and provides wavelength correction control signals based on the learned characteristics to reduce the magnitude of the wavelength shift of the present wavelength chirp and subsequent wavelength chirps.

U.S. Pat. No. 6,735,225, issued to Albrecht et al. on May 11, 2004, entitled CHIRP COMPENSATION METHOD AND APPARATUS, the disclosure of which is hereby incorporated by reference, relates to:

A wavelength chirp compensation method for an excimer or molecular fluorine laser system operating in burst mode, includes pre-programming into a computer of the laser system resonator tuning optic adjustments for making the adjustments during pauses between bursts to compensate wavelength chirp at beginnings of succeeding bursts.

Applicants have observed in the operation of certain gas discharge lasers, e.g., ArF, KrF and molecular fluorine gas discharge lasers, including a lasing medium-creating gas comprising, e.g., fluorine and another gas, e.g., krypton or argon, and a buffer gas or gases, e.g., neon and helium and also in configurations including two chambers, e.g., master oscillator-power amplifier ("MOPA"), master oscillator-power oscillator ("MOPO"), power oscillator-power amplifier ("POPA") and power oscillator-power oscillator) and including even other forms of multi-chambered lasers systems where the chambers may be mounted on a single frame and/or optically interconnected by optics that are physically attached in some way to each chamber, that slow wavelength transients can occur under a variety of circumstances. Applicants have found that such transients are generally burst correlated in laser systems that provide laser output light pulse beams in bursts of pulses per laser output light beam, e.g., one hundred of so pulses at pulse repetition rates varying from, e.g., 2 kHz and above up to, e.g., about 6 kHz or even higher (i.e., with a 500 µs to 167 µs time period or less between pulses) with some down time, e.g., on the order of milliseconds or more between bursts. In addition, other optical elements, e.g., with a line narrowing module ("LNM") which may contain moving parts, e.g., a fast tuning optical element, e.g., a fast tuning mirror, may add vibrational disturbances to the system and may include, e.g., certain resonant frequencies, which, with less than perfect vibrational isolation between laser system modules can impact the occurrence of such transients.

Such transients can be significant, e.g., as much as 0.2 pm in amplitude, which can, under the strict requirements for wavelength pulse to pulse stability and wavelength sigma during a burst, result in the output laser light pulse beam produced by the laser system being out of specification, when operating, e.g., at certain pulse repetition rates where the transients are most significant.

Applicants have found that such transients can take about 100 shots within a single burst, usually starting at pulse one or close to pulse one to build to full amplitude. Typically, also, applicants have found, such transients occur within relatively narrow repetition rate bands.

It is applicants' belief that such transients occur for a variety of reasons, including one which applicants have observed at or around 1700 Hz which most likely is due to mechanical vibrations in the system, e.g., in the LNM and at or around 1850 Hz, which most likely is due to acoustic resonances in a chamber, e.g., in one or both of the chambers in a two chambered system, or only in one, e.g., the MO chamber in, e.g., a MOPA system configuration.

Applicants have further examined the root causes of the inability to deal properly with these transients, and propose in the present application aspects of an embodiment of the present invention relating to such solution.

SUMMARY OF THE INVENTION

An apparatus and method for producing laser output light pulses in bursts of pulses, at a selected pulse repetition rate, forming a laser output light beam, separated by an off time is disclosed, which may comprise a laser output light pulse beam parameter adjustment system, which may comprise a laser output light pulse beam parameter error detector providing a beam parameter error signal representative of the difference between the beam parameter and a selected target value for the beam parameter; a beam parameter adjustment mechanism; a beam parameter adjustment mechanism controller providing a beam parameter adjustment signal to the beam parameter adjustment mechanism based upon the value of the beam parameter error signal; a slow transient compensator providing a slow transient inversion signal modifying the beam parameter adjustment signal based upon the value of the beam parameter error signal. The apparatus and method may further comprise a beam parameter error scaling mechanism providing a normalized beam parameter error signal determined from the value of the beam parameter error signal; and the beam parameter adjustment mechanism controller and the slow transient controller providing, respectively, the beam parameter adjustment signal and the slow transient inversion signal based upon the normalized beam parameter error signal. The beam parameter adjustment mechanism controller may provide the beam parameter adjustment signal based upon a controller function that minimizes the average actual wavelength error or a windowed standard deviation of the actual wavelength error. The slow transient controller may provide the slow transient inversion signal which is a function of the slow transient inversion from a prior burst and a slow transient inversion gain factor multiplied by a beam parameter error signal for a selected pulse in the prior burst. A beam parameter error signal scheduling mechanism may disable the input of the beam parameter error signal to the beam parameter adjustment mechanism at the beginning of a burst to prevent the beam parameter adjustment mechanism from responding to beam parameter fast transients. The selected pulse in the prior burst is selected to avoid being influenced by beam parameter fast transients. The slow transient compensator may also be updated based upon stepper commands that are actually executed as opposed to the total commanded, e.g., based upon actual motion of a secondary actuator, e.g., a stepper motor used to desaturate the beam parameter adjustment signal.

BRIEF DESCRIPTION OF THE DRAWINGS

The application file contains at least one drawing executed in color. Copies of this patent or patent application publication with color drawing(s) will be provided by the Office upon request and payment of the necessary fee.

DETAILED DESCRIPTION OF PREFERRED EMBODIMENTS

Applicants have discovered that the current laser wavelength control systems do not deal well with slow transient wavelength chirp. This is due at least in part to the fact that a wavelength control system wavelength controller, e.g., a wavelength servo acting as a filter for providing a control signal, e.g., a control voltage to a wavelength control mechanism actuator, e.g., a piezoelectric element driving, e.g., a fast tuning mirror, follows the wavelength chirp during the course of a burst and then, on the next burst, the servo needs to respond to whatever discontinuity has accumulated during the burst, e.g., 0.2 pm discontinuity, which can take, e.g., about 20 pulses to correct, with a resultant negative impact on both average wavelength and wavelength sigma during the subsequent burst.

Figure 1:
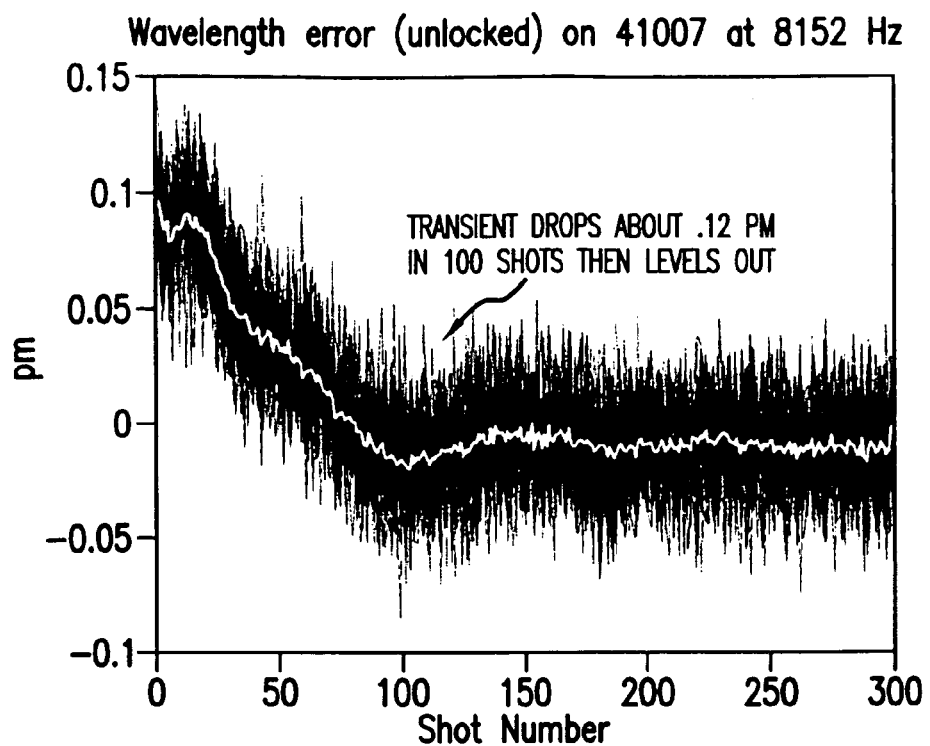
FIG. 1 shows a plot of a wavelength error signal transient to be corrected according to aspects of an embodiment of the present invention.

Turning now to FIG. 1 there is shown an overlay of several bursts of data demonstrating an exemplary transient, e.g., a wavelength transient, during the course of a burst, e.g., in a wavelength error signal over the course of, e.g., the first one hundred or so pulses in a burst of, e.g., several hundred pulses. It can be seen that the transient converges to a value for wavelength error that remains relatively constant during the remainder of the burst after the first one hundred or so pulses of the burst and also has some non-linearities at the very start of the burst during the first few pulses or so of the burst.

Figure 2:
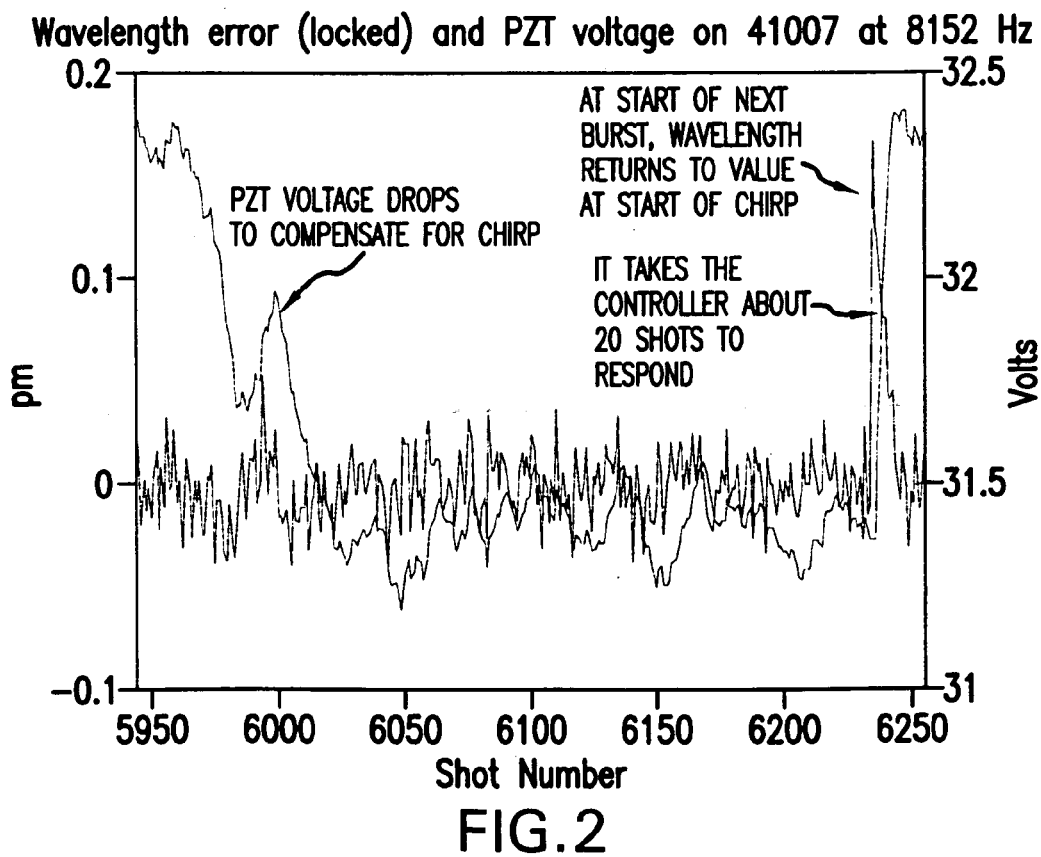
FIG. 2 shows a plot of tuning mirror drive voltage aspects of which can be improved according to aspects of an embodiment of the present invention.
Figure 3:
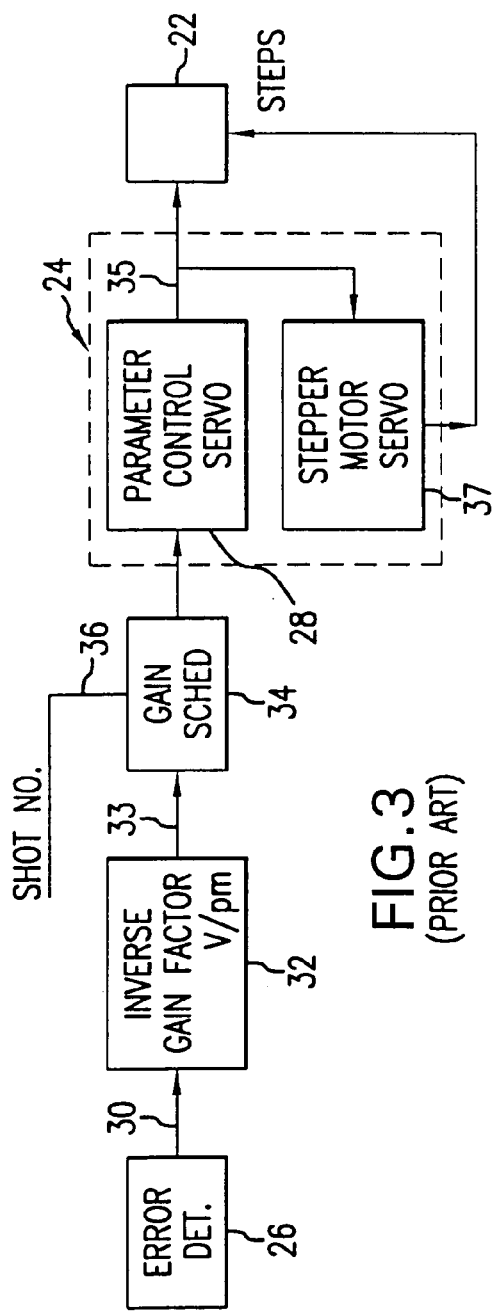
FIG. 3 shows schematically in block diagram form a prior art wavelength control system.

Turning now to FIG. 2 there is shown a further illustration of the control problem relating to burst correlated slow transients such as wavelength chirp. It can be seen that the wavelength control system 20 of FIG. 3 is producing an output signal to the piezoelectric actuator in the fast tuning mirror tilt mechanism shown in above referenced patents but not shown in the present application, to account for the transient in the error signal shown in FIG. 1, during the early part of the illustrated burst, e.g., from about pulse 5940 to about pulse 6025 and then relatively constant about a voltage of around 31.4 volts. At the end of the burst, e.g., at about pulse 6240 when the next burst commenced, the wavelength returns to the value at the initiation of the chirp in the beginning of the burst, as evidenced in FIG. 1, while the controller takes around twenty pulses at the beginning of the burst to respond.

Turning now to FIG. 3 there is shown a laser output light pulse beam parameter adjustment system 20 according to the prior art. The system 20 includes, e.g., a laser output light pulse beam parameter adjustment mechanism 22, which may include, e.g., a stepper motor (not shown) and at least one piezoelectric actuator (not shown), operatively connected to a fast tuning mirror (not shown). The system may also comprise a laser output light pulse beam parameter adjustment mechanism controller 24, which may include a wavelength servo-mechanism 28 acting as a filter to provide, e.g., piezoelectric actuator voltages according to some algorithm, discussed in more detail below, that is a function of an error signal. The beam parameter adjustment mechanism controller 24 may also include a stepper motor servo 37 that can, e.g., receive the PZT voltage correction signal and determine if it is approaching the limit, e.g., for some dynamic range, e.g., a preferred operating range, e.g., around some desired center voltage, such that, in normal operation the change in the, e.g., tuning mirror position is within some range of voltages applied to the PZT driver. When this limit in range is approached then the stepper motor servo orders a step or steps to occur to get the PZT back to its proper dynamic range of operation.

In operation, therefore, the system 20 needs to account for the number of changes to the voltage range occurring during a prior burst in resetting the parameter control servo 28 at the end of each burst.

The system 20 may also include a wavelength error detector 26, e.g., a fast acting wavelength detector as discussed in above referenced patents but not shown in the present application, that produces a wavelength error signal 30, responsive to the difference between the desired and actual wavelengths for, e.g., the immediately preceding pulse (or at higher pulse repetition rates, perhaps one of the several immediately preceding pulses), and a wavelength error scaling mechanism 32, which can, e.g., produce a scaled error signal, e.g., the inverse of the PZT gain factor, i.e., volts/pm for an error signal representative of an wavelength error of a certain pm value. The system 20 may also include a wavelength error gain scheduler 34, which may, e.g., help to deal with other forms of wavelength chirp, e.g., burst-to-burst chirp in the initial pulses, e.g., due to changes in laser system parameters between bursts, which may otherwise be corrected, e.g., by feed forward tuning mirror control, e.g., from a computer processor controller utilizing a learning algorithm, as discussed in above referenced applications. In this regard, the gain scheduler 34 may receive a signal 36 representative of the pulse number, also referred to as the shot number, of pulses, e.g., at the beginning of the burst, and disable the passage of the PZT gain factor to the wavelength servo 24, e.g., for the first several pulses in the burst, as discussed in above referenced patents.

Figure 4:
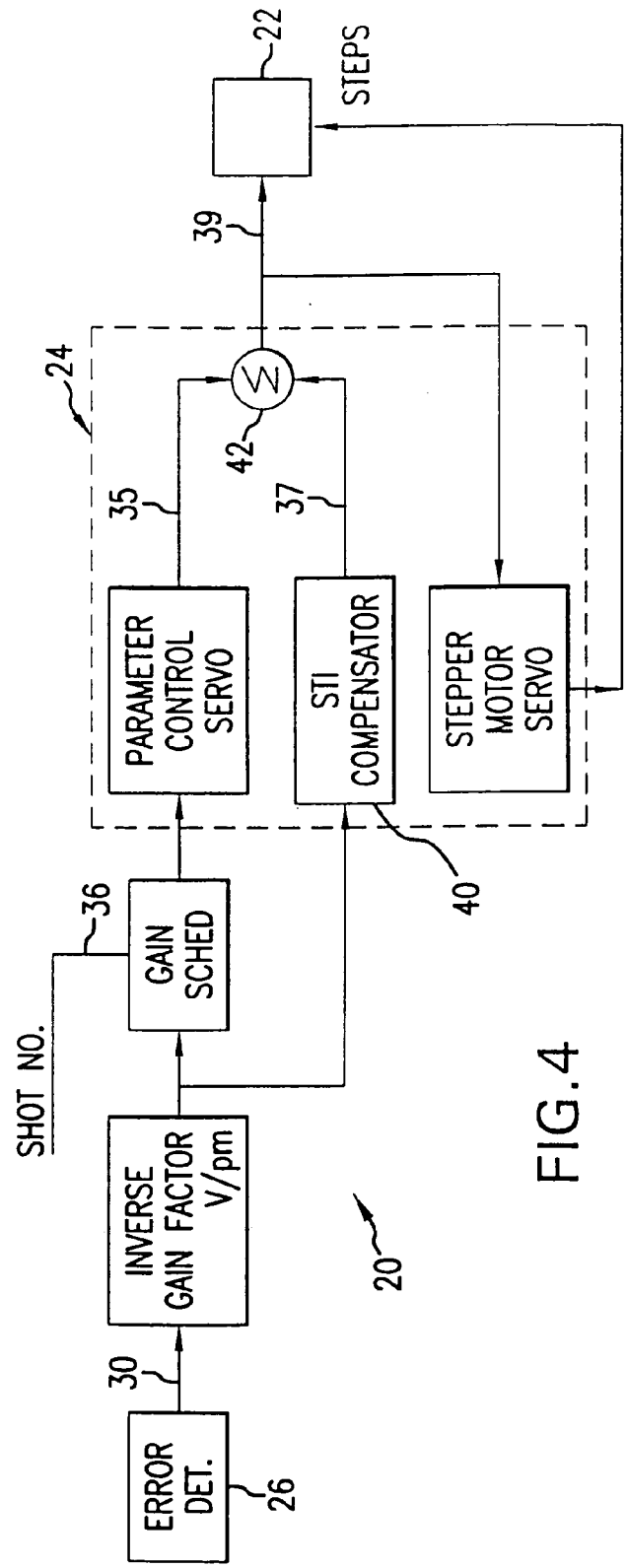
FIG. 4 shows schematically in block diagram format a wavelength error correction circuit according to aspects of an embodiment of the present invention.

Turning now to FIG. 4 there is shown a wavelength control system 20 according to aspects of an embodiment of the present invention which may further include, e.g., a slow transient inversion ("STI") compensator 40. The system of FIG. 4 includes an STI compensator 40, in the controller 24. The STI compensator 40 may be included, e.g., as part of the controller 24 along with the wavelength servo-mechanism 28 of FIG. 3 in such a manner that, e.g., based upon the shot number (pulse number) in a given pulse different equations may be used to describe the filter implemented by the controller 24. On all pulses in a burst, except for feed forward controlled pulses where the gain schedule blocks the submission of the scaled error signal 30 to the wavelength servo 28, the wavelength servo 24 updates the piezelectric actuator drive voltage according to whatever difference equations are described in the wavelength servo 28 portion of the controller 24 filter. On a selected shot from the prior pulse, e.g., shot $n_0$, which may be selected to be, e.g., shot 3 to avoid early burst chirp effects, may have been stored. At, e.g., the end of the burst, the STI compensator then gets updated according to an updating equation, e.g.:

$$STI[k]=STI[k-1]+g_{STI}(\epsilon_0)+g_{steps}(nsteps) \quad (1)$$

where $g_{STI}$ is a selected scaling gain and $\epsilon_0$ is the stored wavelength error for pulse $n_0$ in the prior burst k–1. According to aspects of an embodiment of the present invention this factor STI[k] times the scaled error signal 30 for the burst k is summed with the output of the wavelength servo 28 in summer 42 on every pulse. In addition, the "nsteps" factor is based upon the number of steps actually taken by the stepper motor in the prior burst, it corrects the STI signal for desaturation of the actuator signal during the prior burst, e.g., for step commands actually implemented.

According to aspects of an embodiment of the present invention the present invention offers a simple and effective method and apparatus to desensitize a laser output light parameter control system, e.g., the wavelength control system 20 to burst correlated laser output light pulse parameter variations, e.g., slow chirps, e.g., burst correlated slow wavelength transients, without increasing, e.g., the sensitivity of the parameter control system to fast chirp, e.g. burst to burst wavelength control variations manifested, e.g., as beginning pulse fast chip within a burst.

Figure 5:
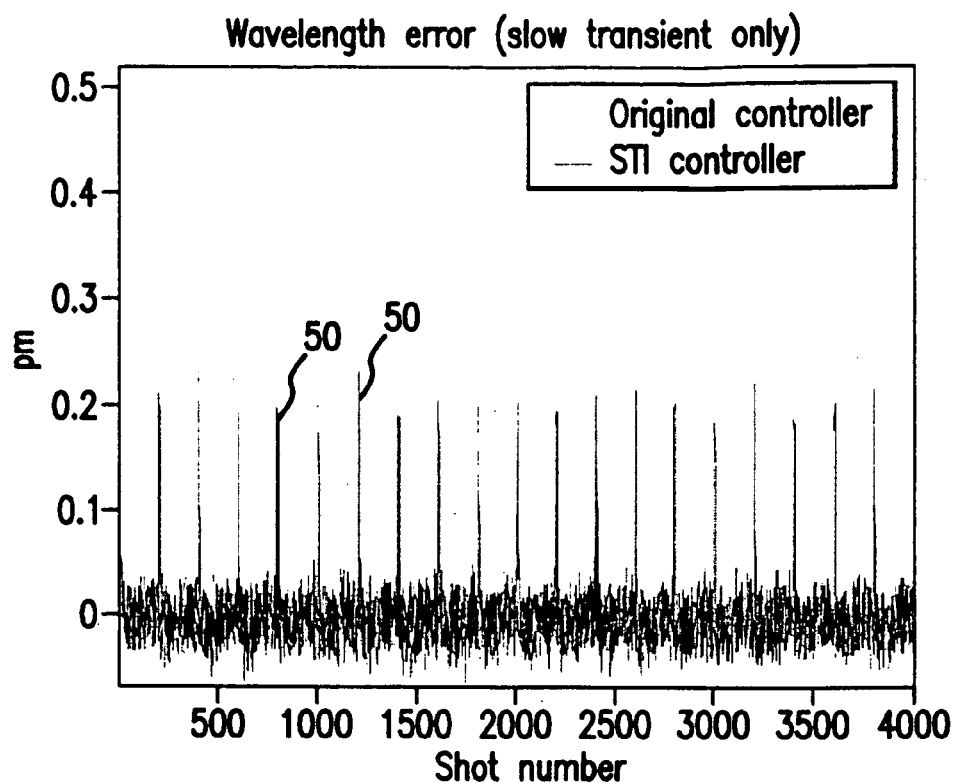
FIGS. 5–8 are plots showing improvements according to aspects of an embodiment of the present invention.
Figure 6:
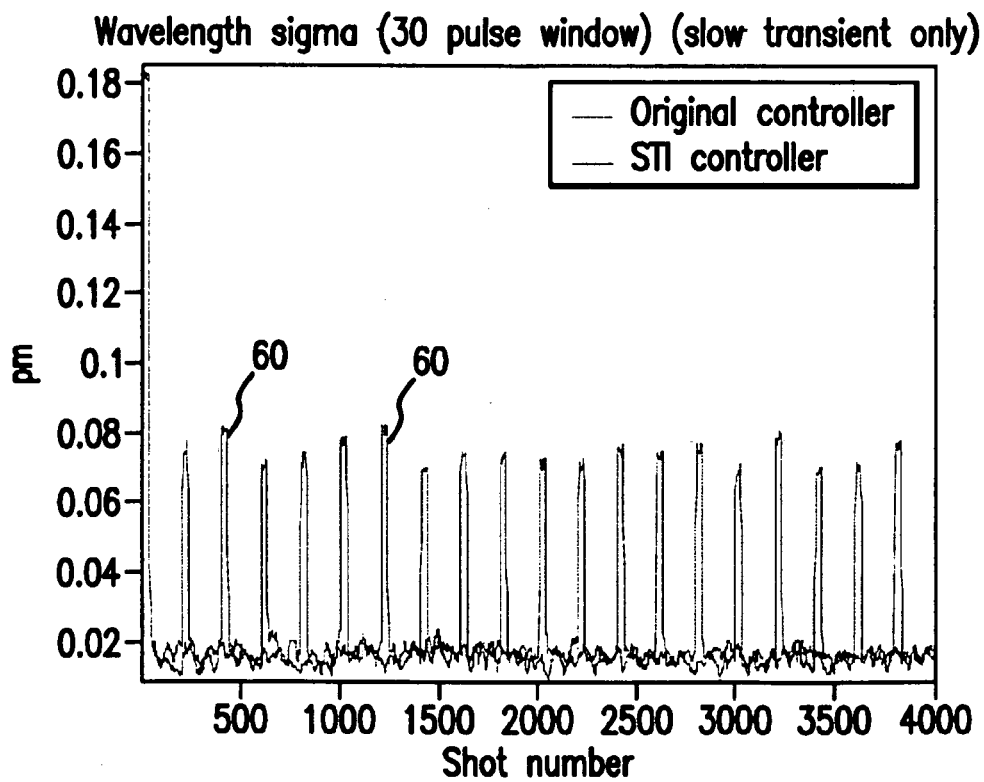
Figure 7:
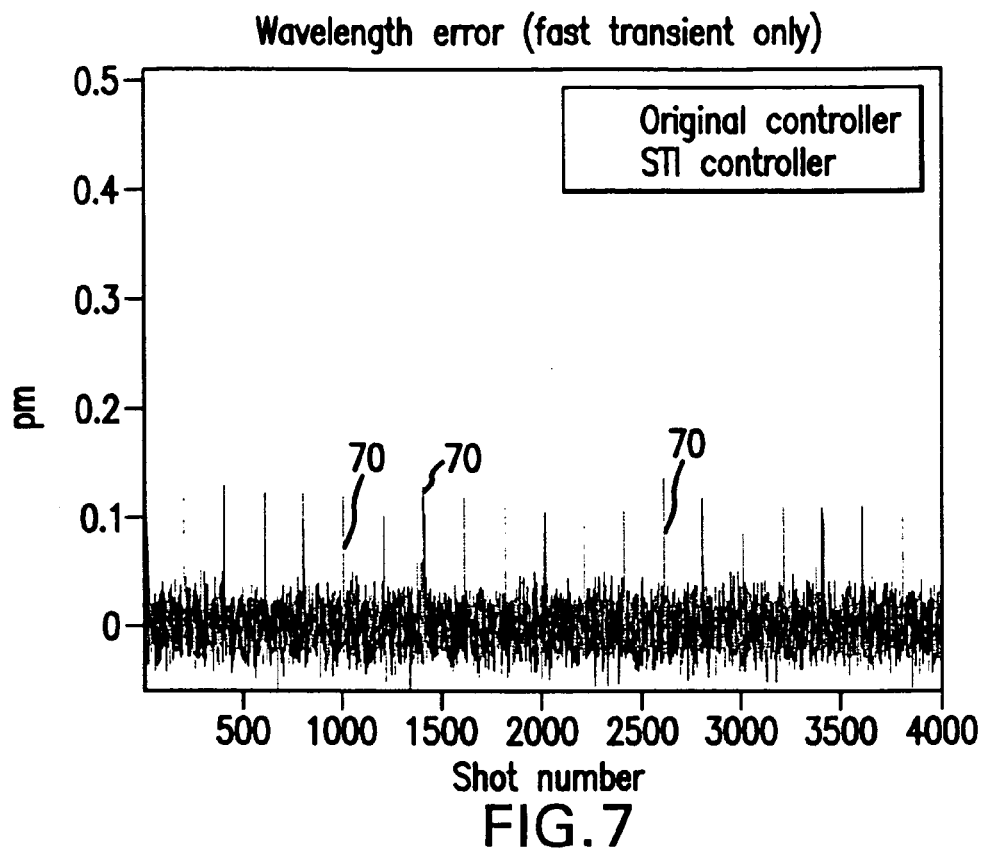
Figure 8:
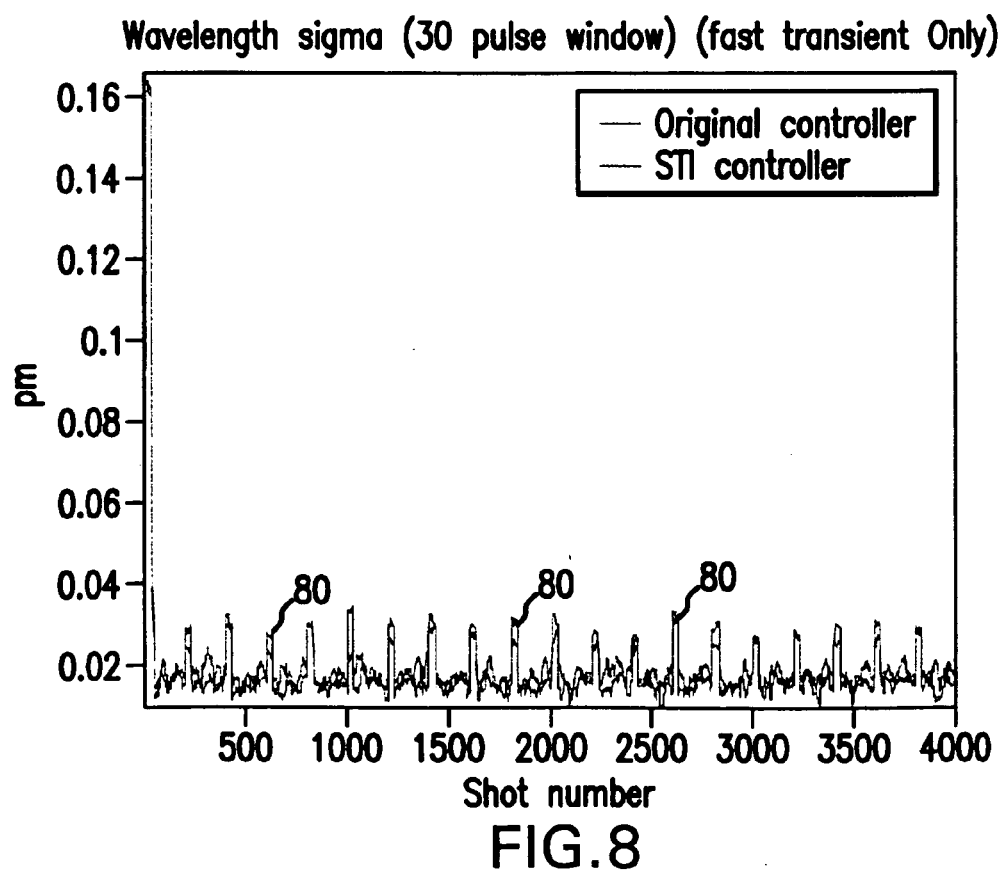

According to aspects of an embodiment of the present invention the wavelength servo may be reset at the end of, e.g., each burst, e.g., to zero and the STI compensator may be updated at the end of each burst according to the above indicated equation (1), with this adjustment to, e.g., the actual PZT control system being selected to minimize the error (i.e., reduce it to near zero) in the control signal at the beginning of the burst because the wavelength servo is reset to zero to account for the tracking of the wavelength servo of the slow transient during the prior pulse and the fact that the slow transient will appear again in the current burst. Turning now to FIG. 5 there is shown a simulation of a system controller 20 according to aspects of an embodiment of the present invention showing the superimposition of wavelength error, with and without using a system controller 24 of FIG. 4, according to aspects of the present invention, wherein the peaks 50 at the beginning of the illustrated bursts appear when a controller system according to aspects of the present invention is not used and disappear when it its used. Turning now to FIG. 6 there is shown a similar simulation for wavelength sigma, with the peaks 60 being without a system controller according to aspects of the present invention and the absence of the peaks 60 being with such a controller. Turning now to FIG. 7 there is shown a simulation of fast transient error only utilizing a system controller according to aspects of am embodiment of the present invention, and without, indicating that the fast transient peaks 70 are essentially unchanged by the utilization of the control system according to the present invention. Turning now to FIG. 8 there is shown essentially the same results for a simulation relating to fast transient only wavelength sigma having peaks 80 that are essentially the same with or without the STI compensation according to aspects of the present invention.

It will be understood by those skilled in the art that according to aspects of an embodiment of the present invention a controller implementing, e.g., an STI algorithm greatly reduces wavelength error sigma and average. According to aspects of an embodiment of the present invention an STI algorithm can give the same performance as current algorithms for fast transients under certain conditions. The STI controller can cause wavelength control to execute upon the end of a burst as well as on arrival of shot data, e.g., also utilizing an end of burst timeout interrupt in the end of burst logic according to aspects of the present invention. Scaling by dλ/dV may be made explicit. The STI servo updates at the end of each burst, while the parameter servo updates every pulse and resets at the end of each burst.

According to aspects of an embodiment of the present invention a potential issue that needs to be addressed may relate to the stepper desaturates the piezoelectric actuator in the laser output light pulse beam parameter adjustment mechanism, e.g., the fast tuning mirror tilt control mechanism, which can result in a relatively large, e.g., up to 8.7V, change in piezoelectric actuator voltage, i.e., up to about an 0.87 pm change in wavelength. This may be addressed according to aspects of an embodiment of the present invention, by, e.g., as noted above, making sure that the "nsteps" factor of the STI equation is updated based upon the actual number of steps that have taken place in the prior burst as opposed to an ordered number of steps, which may be a different higher number, in so doing the system 20 may, e.g., track the actual number of steps taken during a burst and adjust the STI compensator servo 40 voltage accordingly at end of each burst.

In operation an apparatus 20 and method for producing laser output light pulses in bursts of pulses, at a selected pulse repetition rate, forming a laser output light pulse beam, separated by an off time is disclosed, which may comprise a laser output light pulse beam parameter adjustment mechanism 22, which may comprise a laser output light pulse beam parameter error detector 26 providing a beam parameter error signal 30 representative of the difference between the beam parameter and a selected target value for the beam parameter, e.g., wavelength; a beam parameter adjustment mechanism 22, e.g., a fast tuning mechanism tilt controller; a beam parameter adjustment mechanism controller 24, comprising, e.g., a wavelength servo 28, and providing a beam parameter adjustment signal, e.g., a PZT voltage signal to the beam parameter adjustment mechanism 22 based upon the value of the beam parameter error signal 30; and a slow transient inversion controller 40, which may also comprise a portion of the controller 24, providing a slow transient inversion signal modifying the beam parameter adjustment signal, e.g., by being summed with such beam parameter adjustment signal, based upon the value of the beam parameter error signal. The apparatus and method may further comprise a beam parameter error scaling mechanism 32 providing a normalized beam parameter error signal determined from the value of the beam parameter error signal 30; and the beam parameter adjustment mechanism controller 25 and the slow transient controller 40 providing, respectively, the beam parameter adjustment signal and the slow transient inversion signal based upon the normalized beam parameter error signal 30. The beam parameter adjustment mechanism controller 28 may provide the beam parameter adjustment signal based upon a controller function that minimizes the average actual wavelength error or a windowed standard deviation of the actual wavelength error. The slow transient controller 40 may provide the slow transient inversion signal which is a function of a slow transient inversion error determined from a slow transient inversion signal at the end of a prior burst and a slow transient inversion gain factor multiplied by a beam parameter error signal for a selected pulse in the prior burst. A beam parameter error signal scheduling mechanism 34 may disable the input of the beam parameter error signal to the beam parameter adjustment means for controller at the beginning of a burst to prevent the beam parameter adjustment means from responding to beam parameter fast transients. The selected pulse in the prior burst is selected to avoid being influenced by beam parameter fast transients.

Those skilled in the art will further understand that many changes and modifications may be made according to aspects of embodiments of the present invention as described herein and that the illustrative embodiment(s) are not meant to be limiting or to be sole or optimized embodiments but only illustrative of preferred embodiments. For example, many beam parameters in addition to wavelength may suffer from slow transients that are, e.g., burst correlated, and can be addressed in the same fashion as noted above according to aspects of an embodiment of the present invention. These may include, e.g., any parameter adjustments that are made with an actuator that may become saturated during a burst and is consequently desaturated during the burst, e.g., by another part of the actuator being implemented, i.e., stepper motor corrections during a burst to adjust the dynamic range of the PZT actuator. They may include bandwidth, where, e.g., active bandwidth or like wavefront adjustment is implemented, deviations from a selected RELAX parameter(s), pulse energy stability, overall dose stability and the like. The inventions of the present I/we claim:

1. A laser light source producing laser output light pulses in bursts of pulses, at a selected pulse repetition rate, forming a laser output light pulse beam, separated by an off time, comprising:
   a laser output light pulse beam parameter adjustment system comprising:
      a laser output light pulse beam parameter error detector providing a beam parameter error signal representative of the difference between the beam parameter and a selected target value for the beam parameter;
      a beam parameter adjustment mechanism;
      a beam parameter adjustment mechanism controller providing a beam parameter adjustment signal to the beam parameter adjustment mechanism based upon the value of the beam parameter error signal;
      a slow transient compensator providing a slow transient inversion signal modifying the beam parameter adjustment signal based upon the value of the beam parameter error signal.

2. The apparatus of claim 1 further comprising:
   a beam parameter error scaling mechanism providing a normalized beam parameter error signal determined from the value of the beam parameter error signal;
   the beam parameter adjustment mechanism controller and the slow transient controller providing, respectively, the beam parameter adjustment signal and the slow transient inversion signal based upon the normalized beam parameter error signal.

3. The apparatus of claim 2 further comprising:
   the beam parameter adjustment mechanism controller providing the beam parameter adjustment signal based upon a controller function that minimizes the average actual wavelength, error.

4. The apparatus of claim 3 further comprising:
   the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

5. The apparatus of claim 4 further comprising:
   a beam parameter error signal scheduling mechanism disabling the input of the normalized beam parameter error signal to the beam parameter adjustment mechanism at the beginning of a burst to prevent the beam parameter adjustment mechanism from responding to beam parameter fast transients.

6. The apparatus of claim 5 further comprising:
   the selected pulse in the prior burst is selected to avoid being influenced by beam parameter fast transients.

7. The apparatus of claim 4 further comprising:
   the selected pulse in the prior burst is selected to avoid being influenced by beam parameter fast transients.

8. The apparatus of claim 2 further comprising:
   the beam parameter adjustment mechanism controller providing the beam parameter adjustment signal based upon a controller function that minimizes a windowed standard deviation of the actual wavelength error.

9. The apparatus of claim 8 further comprising:
   the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

10. The apparatus of claim 9 further comprising:
    a beam parameter error signal scheduling mechanism disabling the input of the normalized beam parameter error signal to the beam parameter adjustment mechanism at the beginning of a burst to prevent the beam parameter adjustment mechanism from responding to beam parameter fast transients.

11. The apparatus of claim 10 further comprising:
    the selected pulse in the prior burst is selected to avoid being influenced by beam parameter fast transients.

12. The apparatus of claim 9 further comprising:
    the selected pulse in the prior burst is selected to avoid being influenced by beam parameter fast transients.

13. The apparatus of claim 2 further comprising:
    the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

14. The apparatus of claim 13 further comprising:
    a beam parameter error signal scheduling mechanism disabling the input of the normalized beam parameter error signal to the beam parameter adjustment mechanism at the beginning of a burst to prevent the beam parameter adjustment mechanism from responding to beam parameter fast transients.

15. The apparatus of claim 14 further comprising:
    the selected pulse in the prior burst is selected to avoid being influenced by beam parameter fast transients.

16. The apparatus of claim 13 further comprising:
    the selected pulse in the prior burst is selected to avoid being influenced by beam parameter fast transients.

17. The apparatus of claim 2, further comprising:
    a beam parameter adjustment mechanism stepper mechanism;
    a beam parameter adjustment mechanism stepper mechanism controller mechanism providing step commands comprising stepper commands that are not executed within a given burst;
    the beam parameter adjustment mechanism controller updating the slow transient inversion signal at the end of a given burst for use with the next burst based upon the commanded steps minus the stepper commands that are not executed.

18. The apparatus of claim 1 further comprising:
    the beam parameter adjustment mechanism controller providing the beam parameter adjustment signal based upon a controller function that minimizes the average actual wavelength error.

19. The apparatus of claim 18 further comprising:
    the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

20. The apparatus of claim 19 further comprising:
    a beam parameter error signal scheduling mechanism disabling the input of the normalized beam parameter error signal to the beam parameter adjustment mechanism at the beginning of a burst to prevent the beam parameter adjustment mechanism from responding to beam parameter fast transients.

21. The apparatus of claim 20 further comprising:
the selected pulse in the prior burst is selected to avoid being influenced by beam parameter fast transients.

22. The apparatus of claim 18, further comprising:
a beam parameter adjustment mechanism stepper mechanism;
a beam parameter adjustment mechanism stepper mechanism controller mechanism providing step commands comprising stepper commands that are not executed within a given burst;
the beam parameter adjustment mechanism controller updating the slow transient inversion signal at the end of a given burst for use with rho next burst based upon the commanded steps minus the stepper commands that are not executed.

23. The apparatus of claim 19 further comprising:
the selected pulse in the prior burst is selected to avoid being influenced by beam parameter fast transients.

24. The apparatus of claim 1 further comprising:
the beam parameter adjustment mechanism, controller providing the beam parameter adjustment signal based upon a controller function that minimizes a windowed standard deviation of the actual wavelength error.

25. The apparatus of claim 24 further comprising:
the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

26. The apparatus of claim 25 further comprising:
a beam parameter error signal scheduling mechanism disabling the input of the normalized beam parameter error signal to the beam parameter adjustment mechanism at the beginning of a burst to prevent the beam parameter adjustment mechanism from responding to beam parameter fast transients.

27. The apparatus of claim 26 further comprising:
the selected pulse in the prior burst is selected to avoid being influenced by beam parameter fast transients.

28. The apparatus of claim 25 further comprising:
the selected pulse in the prior burst is selected to avoid being influenced by beam parameter fast transients.

29. The apparatus of claim 1 further comprising:
the slow transient controller providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

30. The apparatus of claim 29 Further comprising:
a beam parameter error signal scheduling mechanism disabling the input of the beam parameter error signal to the beam parameter adjustment mechanism at the beginning of a burst to prevent the beam parameter adjustment mechanism from responding to beam parameter fast transients.

31. The apparatus of claim 30 further comprising:
the selected pulse in the prior burst is selected to avoid being influenced by beam parameter fast transients.

32. The apparatus of claim 29 further comprising:
the selected pulse in the prior burst is selected to avoid being influenced by beam parameter fast transients.

33. The apparatus of claim 1, further comprising:
a beam parameter adjustment mechanism stepper mechanism;
a beam parameter adjustment mechanism stepper mechanism controller mechanism providing step commands comprising stepper commands that are not executed within a given burst;
the beam parameter adjustment mechanism controller updating the slow transient inversion signal at the end of a given burst for use with the next burst based upon the slow transient inversion signal for a selected pulse in the given burst.

34. A laser light source producing laser output light pulses in bursts of pulses, at a selected pulse repetition rate, forming a laser output light pulse beam, separated by an off time, comprising:
a laser output light pulse beam parameter adjustment system comprising:
a laser output light pulse beam parameter error detection means for providing a beam parameter error signal representative of the difference between the beam parameter and a selected target value for the beam parameter;
a beam parameter adjustment means;
a beam parameter adjustment means controller means for providing a beam parameter adjustment signal to the beam parameter adjustment means based upon the value of the beam parameter error signal;
a slow transient controller means for providing a slow transient inversion signal modifying the beam parameter adjustment signal based upon the value of the beam parameter error signal.

35. The apparatus of claim 34 further comprising:
a beam parameter error scaling means for providing a normalized beam parameter error signal determined from the value of the beam parameter error signal;
the beam parameter adjustment means controller means and the slow transient controller means providing, respectively, the beam parameter adjustment signal and the slow transient inversion signal based upon the normalized beam parameter error signal.

36. The apparatus of claim 35 further comprising:
the beam parameter adjustment means controller means including a means for providing the beam parameter adjustment signal based upon a controller function that minimizes the average actual wavelength error.

37. The apparatus of claim 36 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

38. The apparatus of claim 37 further comprising:
a beam parameter error signal scheduling means including means for disabling the input of the normalized beam parameter error signal to the beam parameter adjustment means at the beginning of a burst to prevent the beam parameter adjustment means for from responding to beam parameter fast transients.

39. The apparatus of claim 38 further comprising:
the selected pulse in the prior burst is selected to avoid being influenced by beam parameter fast transients.

40. The apparatus of claim 37 further comprising:
the selected pulse in the prior burst is selected to avoid being influenced by beam parameter fast transients.

41. The apparatus of claim 35 further comprising:
the beam parameter adjustment means controller means including a means for providing the beam parameter adjustment signal based upon a controller function that minimizes a windowed standard deviation of the actual wavelength error.

42. The apparatus of claim 41 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

43. The apparatus of claim 42 further comprising:
a beam parameter error signal scheduling means including means for disabling the input of the normalized beam parameter error signal to the beam parameter adjustment means at the beginning of a burst to prevent the beam parameter adjustment means fur from responding to beam parameter fast transients.

44. The apparatus of claim 43 further comprising:
the selected pulse in the prior burst is selected to avoid being influenced by beam parameter fast transients.

45. The apparatus of claim 42 further comprising:
the selected pulse in the prior burst is selected to avoid being influenced by beam parameter fast transients.

46. The apparatus of claim 35 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

47. The apparatus of claim 46 further comprising:
a beam parameter error signal scheduling means including means for disabling the input of the normalized beam parameter error signal to the beam parameter adjustment means at the beginning of a burst to prevent the beam parameter adjustment means from responding to bean, parameter fast transients.

48. The apparatus of claim 47 further comprising:
the selected pulse in the prior burst is selected to avoid being influenced by beam parameter fast transients.

49. The apparatus of claim 46 further comprising;
the selected pulse in the prior burst is selected to avoid being influenced by beam parameter fast transients.

50. The apparatus of claim 34 further comprising:
the beam parameter adjustment means controller means including a means for providing the beam parameter adjustment signal based upon a controller function that minimizes the average actual wavelength error.

51. The apparatus of claim 50 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

52. The apparatus of claim 51 further comprising:
a beam parameter error signal scheduling means including means for disabling the input of the normalized beam parameter error signal to the beam parameter adjustment means at the beginning of a burst to prevent the beam parameter adjustment means from responding to beam parameter fast transients.

53. The apparatus of claim 52 further comprising;
the selected pulse in the prior burst is selected to avoid being influenced by bean parameter fast transients.

54. The apparatus of claim 51 further comprising:
the selected pulse in the prior burst is selected to avoid being influenced by beam parameter fast transients.

55. The apparatus of claim 34 further comprising:
the beam parameter adjustment means controller means including a means for providing the beam parameter adjustment signal based upon a controller function that minimizes a windowed standard deviation of the actual wavelength error.

56. The apparatus of claim 55 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

57. The apparatus of claim 56 further comprising:
a beam parameter error signal scheduling means including means for disabling the input of the normalized beam parameter error signal to the beam parameter adjustment means at the beginning of a burst to prevent the beam parameter adjustment means for from responding to beam parameter fast transients.

58. The apparatus of claim 57 further comprising:
the selected pulse in the prior burst is selected to avoid being influenced by beam parameter fast transients.

59. The apparatus of claim 56 further comprising:
the selected pulse in the prior burst is selected to avoid being influenced by beam parameter fast transients.

60. The apparatus of claim 34 further comprising:
the slow transient controller means including means for providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

61. The apparatus of claim 60 further comprising:
a beam parameter error signal scheduling means including means for disabling the input of the beam parameter error signal to the beam parameter adjustment means at the beginning of a burst to prevent the beam parameter adjustment means from responding to beam parameter fast transients.

62. The apparatus of claim 61 further comprising:
the selected pulse in the prior burst is selected to avoid being influenced by beam parameter fast transients.

63. The apparatus of claim 60 further comprising:
the selected pulse in the prior burst is selected to avoid being influenced by beam parameter fast transients.

64. A method of producing laser output light pulses in bursts of pulses, at a selected pulse repetition rate, forming a laser output light pulse beam, separated by an off time, comprising:
using a laser output light pulse beam parameter adjustment method comprising:
using a laser output light pulse beam parameter error detection mechanism for providing a beam parameter error signal representative of the difference between the beam parameter and a selected target value for the beam parameter;

using a beam parameter adjustment mechanism;

using a beam parameter adjustment mechanism controller mechanism, providing a beam parameter adjustment signal to the beam parameter adjustment mechanism based upon the value of the beam parameter error signal;

using a slow transient controller mechanism, providing a slow transient inversion signal modifying the beam parameter adjustment signal based upon the value of the beam parameter error signal.

65. The method of claim 64 further comprising:

using a beam parameter error scaling mechanism, providing a normalized beam parameter error signal determined from the value of the beam parameter error signal;

the beam parameter adjustment mechanism controller mechanism and the slow transient controller mechanism providing, respectively, the beam parameter adjustment signal and the slow transient inversion signal based upon the normalized beam parameter error signal.

66. The method of claim 65 further comprising:

utilizing the beam parameter adjustment mechanism controller mechanism, providing the beam parameter adjustment signal bused upon a controller function that minimizes the average actual wavelength error.

67. The method of claim 66 further comprising:

the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

68. The method of claim 67 further comprising:

utilizing a beam parameter error signal scheduling mechanism, disabling the input of the normalized beam parameter error signal to the beam parameter adjustment mechanism at the beginning of a burst to prevent the beam parameter adjustment mechanism for from responding to beam parameter fast transients.

69. The method of claim 68 further comprising:

the selected pulse in the prior burst is selected to avoid being influenced by beam parameter fast transients.

70. The method of claim 67 further comprising:

the selected pulse in the prior burst is selected to avoid being influenced by beam parameter fast transients.

71. The method of claim 65 further comprising:

utilizing the beam parameter adjustment mechanism controller mechanism providing the beam parameter adjustment signal based upon a controller function that minimizes a windowed standard deviation of the actual wavelength error.

72. The method of claim 71 further comprising:

the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

73. The method of claim 72 further comprising:

utilizing a beam parameter error signal scheduling mechanism, disabling the input of the normalized beam parameter error signal to the beam parameter adjustment mechanism at the beginning of a burst to prevent the beam parameter adjustment mechanism for from responding to beam parameter fast transients.

74. The method of claim 73 further comprising:

the selected pulse in the prior burst is selected to avoid being influenced by beam parameter fast transients.

75. The method of claim 72 further comprising:

the selected pulse in the prior burst is selected to avoid being influenced by beam parameter fast transients.

76. The method of claim 65 further comprising:

the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

77. The method of claim 76 further comprising:

utilizing a beam parameter error signal scheduling mechanism, disabling the input of the normalized beam parameter error signal to the beam parameter adjustment mechanism at the beginning of a burst to prevent the beam parameter adjustment mechanism from responding to beam parameter fast transients.

78. The method of claim 77 further comprising:

the selected pulse in the prior burst is selected to avoid being influenced by beam parameter fast transients.

79. The method of claim 76 further comprising:

the selected pulse in the prior burst is selected to avoid being influenced by beam parameter fast transients.

80. The method of claim 64 further comprising:

using the beam parameter adjustment mechanism controller mechanism, providing the beam parameter adjustment signal based upon a controller function that minimizes the average actual wavelength error.

81. The method of claim 80 further comprising:

the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

82. The method of claim 81 further comprising:

utilizing a beam parameter error signal scheduling mechanism, disabling the input of the normalized beam parameter error signal to the beam parameter adjustment mechanism at the beginning of a burst to prevent the beam parameter adjustment mechanism from responding to beam parameter fast transients.

83. The method of claim 82 further comprising:

the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

84. The method of claim 83 further comprising:

utilizing a beam parameter error signal scheduling mechanism, disabling the input of the normalized beam parameter error signal to the beam parameter adjustment mechanism at the beginning of a burst to prevent the beam parameter adjustment mechanism for from responding to beam parameter fast transients.

85. The method of claim 84 further comprising:
the selected pulse in the prior burst is selected to avoid being influenced by beam parameter fast transients.

86. The method of claim 81 further comprising:
the selected pulse in the prior burst is selected to avoid being influenced by beam parameter fast transients.

87. The method of claim 82 further comprising:
the selected pulse in the prior burst is selected to avoid being influenced by beam parameter fast transients.

88. The method of claim 83 further comprising:
the selected pulse in the prior burst is selected to avoid being influenced by beam parameter fast transients.

89. The method of claim 64 further comprising;
utilizing the beam parameter adjustment mechanism controller mechanism, providing the beam parameter adjustment signal bused upon a controller function that minimizes a windowed standard deviation of the actual wavelength error.

90. The method of claim 64 further comprising:
the slow transient controller mechanism providing the slow transient inversion signal which is a function of a slow transient inversion constant determined from a slow transient inversion signal at the end of a prior burst and an slow transient inversion gain factor multiplied by a beam parameter error signal for a selected pulse in the prior burst.

91. The method of claim 90 further comprising:
utilizing a beam parameter error signal scheduling mechanism disabling the input of the beam parameter error signal to the beam parameter adjustment mechanism at the beginning of a burst to prevent the beam parameter adjustment mechanism from responding to beam parameter fast transients.

92. The method of claim 91 further comprising:
the selected pulse in the prior burst is selected to avoid being influenced by beam parameter fast transients.

93. The method of claim 90 further comprising:
the selected pulse in the prior burst is selected to avoid being influenced by beam parameter fast transients.

* * * * *